(12) United States Patent
Chou

(10) Patent No.: US 7,796,386 B2
(45) Date of Patent: Sep. 14, 2010

(54) ELECTRONIC DEVICE WITH AIRFLOW REVERSAL PREVENTION ASSEMBLY

(75) Inventor: Ming-Der Chou, Taipei Hsein (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 37 days.

(21) Appl. No.: 12/344,574

(22) Filed: Dec. 28, 2008

(65) Prior Publication Data

US 2010/0124017 A1 May 20, 2010

(30) Foreign Application Priority Data

Nov. 14, 2008 (CN) .................... 2008 1 0305548

(51) Int. Cl.
*H05K 7/20* (2006.01)
(52) U.S. Cl. .................. 361/695; 361/679.48; 361/690; 415/61; 417/42; 417/45; 454/184
(58) Field of Classification Search ............ 361/679.48, 361/688, 689, 690, 692, 694, 695, 697
See application file for complete search history.

(56) References Cited

U.S. PATENT DOCUMENTS

| 5,137,428 | A * | 8/1992 | Poll et al. ...................... 417/45 |
| 6,364,761 | B1 * | 4/2002 | Steinbrecher ................ 454/184 |
| 6,537,019 | B1 * | 3/2003 | Dent ........................... 415/61 |
| 7,408,774 | B1 * | 8/2008 | Anderl et al. ................ 361/695 |
| 7,529,085 | B2 * | 5/2009 | Makley et al. ......... 361/679.48 |
| 7,656,660 | B2 * | 2/2010 | Hoeft et al. ............ 361/679.51 |
| 7,663,881 | B2 * | 2/2010 | Kuo ........................... 361/692 |
| 2005/0241810 | A1 * | 11/2005 | Malone et al. .............. 165/122 |

* cited by examiner

*Primary Examiner*—Jayprakash N Gandhi
*Assistant Examiner*—Courtney Smith
(74) *Attorney, Agent, or Firm*—Zhigang Ma

(57) ABSTRACT

An electronic device includes a housing, an active fan installed in the housing, and an airflow reversal prevention assembly. The assembly includes a fixed rack secured to the housing opposite to the active fan, a movable rack, a passive fan, a curtain shelter, a shaft, and a resilient member. The curtain shelter is attached between the fixed rack and the movable rack. The shaft is fixedly passed through the movable rack and the passive fan to be rotatably secured to the fixed rack. The passive fan is driven by air from the active fan to rotate, thereby driving the movable rack to rotate relative to the fixed rack by the shaft to allow the curtain shelter being folded up. The resilient member can urge the movable rack to rotate back to allow the curtain shelter being spread open.

15 Claims, 4 Drawing Sheets

ELECTRONIC DEVICE WITH AIRFLOW REVERSAL PREVENTION ASSEMBLY

CROSS-REFERENCE TO RELATED APPLICATION

Relevant subject matter is disclosed in a co-pending U.S. Patent Application with application Ser. No. 12/251,423, filed on Oct. 14, 2008 and entitled with "ELECTRONIC DEVICE WITH AIRFLOW REVERSAL PREVENTION ASSEMBLY", assigned to the same assignee as this patent application. The specification of the co-pending application is hereby incorporated by reference.

BACKGROUND

1. Technical Field

The present disclosure relates to electronic devices and, more particularly, to an electronic device having an airflow reversal prevention assembly.

2. Description of Related Art

In recent years, electronic devices, such as computer systems, have been developed to operate at ever higher speeds, and thus generate a lot of heat during operation. Usually, heat dissipation apparatuses such as motor driven fans and blowers are applied in the electronic devices for dissipating the heated air. Air vents are defined in the enclosures of the electronic devices adjacent the place where the dissipation apparatuses are fixed, for venting the heated air therethrough. However, if one of or more of several heat dissipation apparatuses malfunction in an electronic device, heated air expelled by the remaining working apparatuses may flow back into the device through a vent or vents of the one or more malfunctioning apparatuses.

What is desired, therefore, is an electronic device which has an airflow reversal prevention assembly.

DETAILED DESCRIPTION

Figure 1:
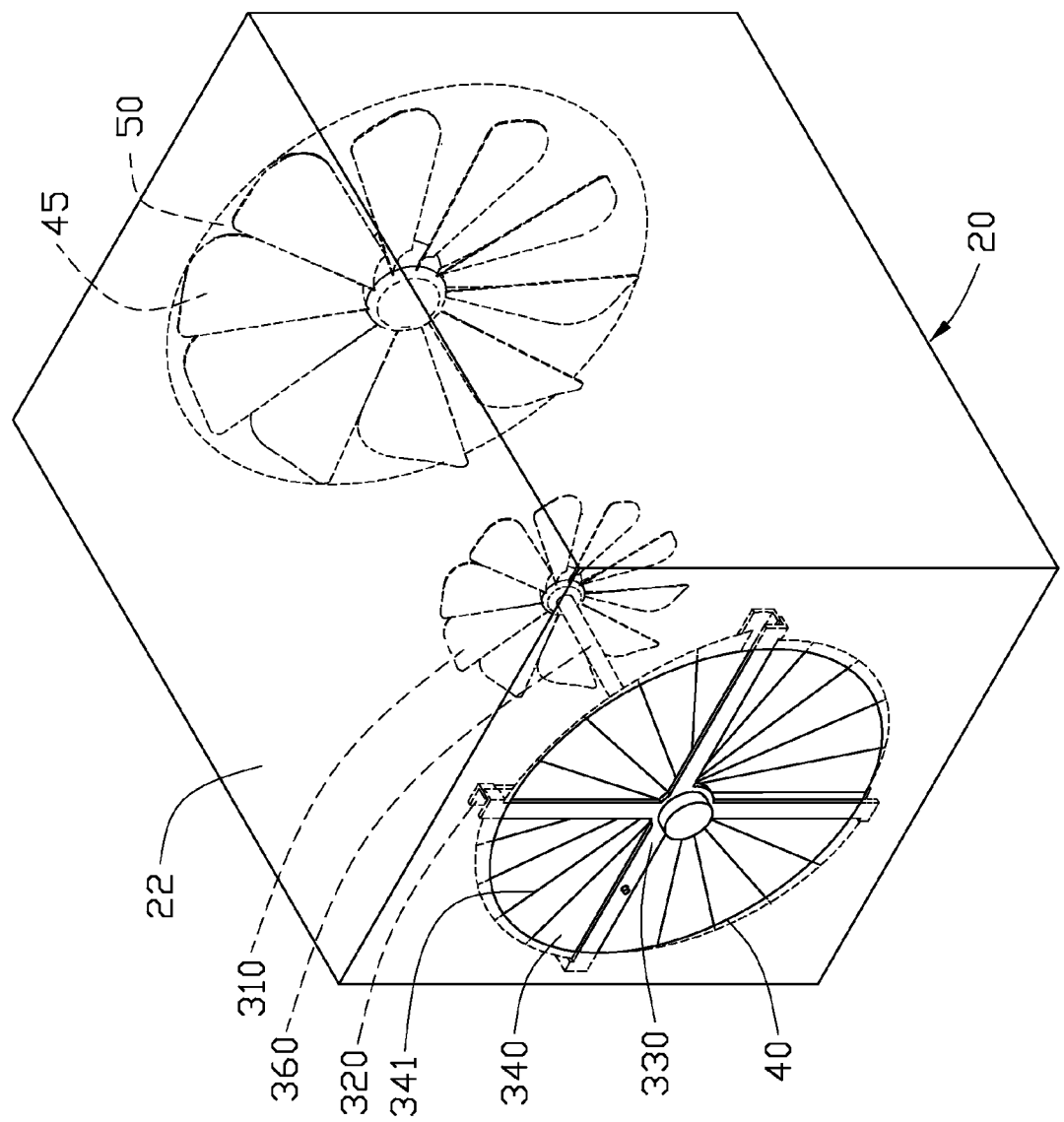
FIG. 1 is an isometric, schematic view of an embodiment of an electronic device, the electronic device including a housing, an active fan, and an airflow reversal prevention assembly in a closed position.
Figure 2:
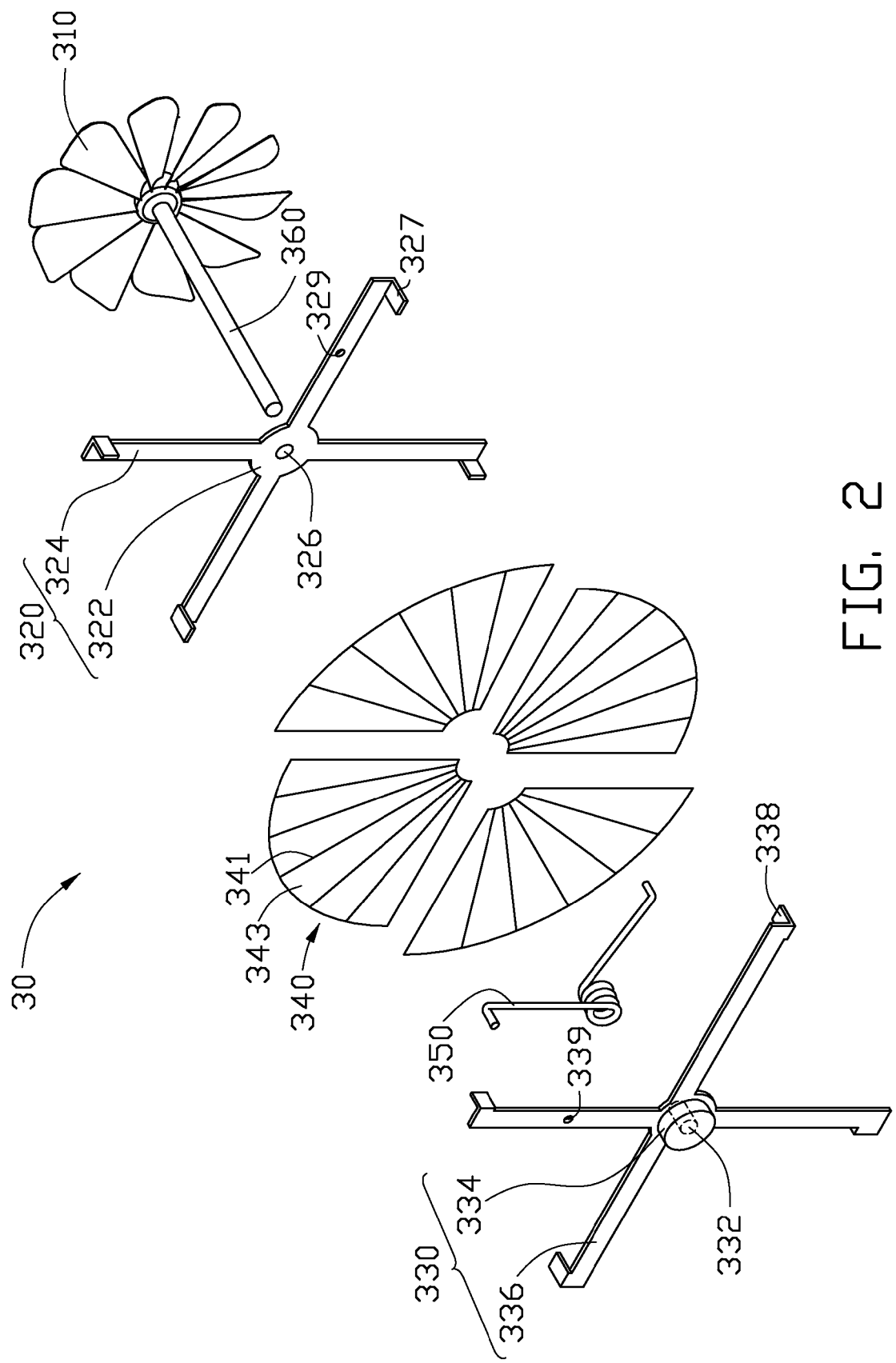
FIG. 2 is a schematic, exploded view of the airflow reversal prevention assembly of FIG. 1.

Referring to FIGS. 1 and 2, in an embodiment, an electronic device 20 includes a housing 22 defining an inlet 50 and an outlet 40 at two opposite ends thereof, an electric active fan 45 installed in the housing 20 adjacent the inlet 50, and an airflow reversal prevention assembly 30 fixed in the housing 20 adjacent the outlet 40. The airflow reversal prevention assembly 30 includes a passive fan 310, an elongated shaft 360 fixed to the passive fan 310, a movable rack 320, a fixed rack 330, a curtain shelter 340, and a resilient member. In the embodiment, the resilient member is a spiral torsion spring 350 including a spiral hollow portion and two elongated ends. The electronic device 20 may include various functional components, which are not necessary to be shown here.

The movable rack 320 is generally cross-shaped, and includes a center portion 322 and four elongated legs 324 radially extending out from a peripheral edge of the center portion 322. A through hole 326 is defined in the center portion 322. An abutting lip 327 is bent from a distal end of each elongated leg 324. An installing hole 329 is defined in one elongated leg 324. The fixed rack 330 includes a center boss 334 and four elongated arms 336 radially extending out from a circumference of the center boss 334. A shaft hole 332 is defined in the center boss 334. A stop tab 338 is bent from a distal end of each elongated arm 324. A retaining hole 339 is defined in one elongated arm 336.

The curtain shelter 340 includes four sector-shaped curtain segments 343. Each curtain segment 343 includes a plurality of leaves 341 extendable and foldable in a radial direction, and thus can be folded up conveniently. The passive fan 310 is fixed at an end of the elongated shaft 360.

In assembly, the movable rack 320 is fixed to the elongated shaft 360 with the free end of the elongated shaft 360 passing through the through hole 326 of the movable rack 320. The free end of the elongated shaft 360 is inserted through the spiral hollow portion of the torsion spring 350 to rotatably engage in the shaft hole 332 of the fixed rack 330. Two elongated ends of the torsion spring 350 are latched in the installing hole 329 of the movable rack 320 and the retaining hole 339 of the fixed rack 330. Thus the torsion spring 350 is assembled between the movable rack 320 and the fixed rack 330. The abutting lips 327 of the movable rack 320 are able to engage with the corresponding stop tabs 338 of the fixed rack 330. Two radial edges of each curtain segment 343 are glued to one elongated leg 324 of the movable rack 322 and one adjacent elongated arm 336 of the fixed rack 330. The airflow reversal prevention assembly 30 is assembled together and fixed in the housing 22 at the outlet 40 via the fixed rack 330 by a plurality of fasteners (not shown). The curtain segments 343 of the curtain shelter 340 cooperatively close the outlet 40 when the electric active fan 45 does not work. At this point the airflow reversal prevention assembly 30 is in a closed position.

Figure 3:
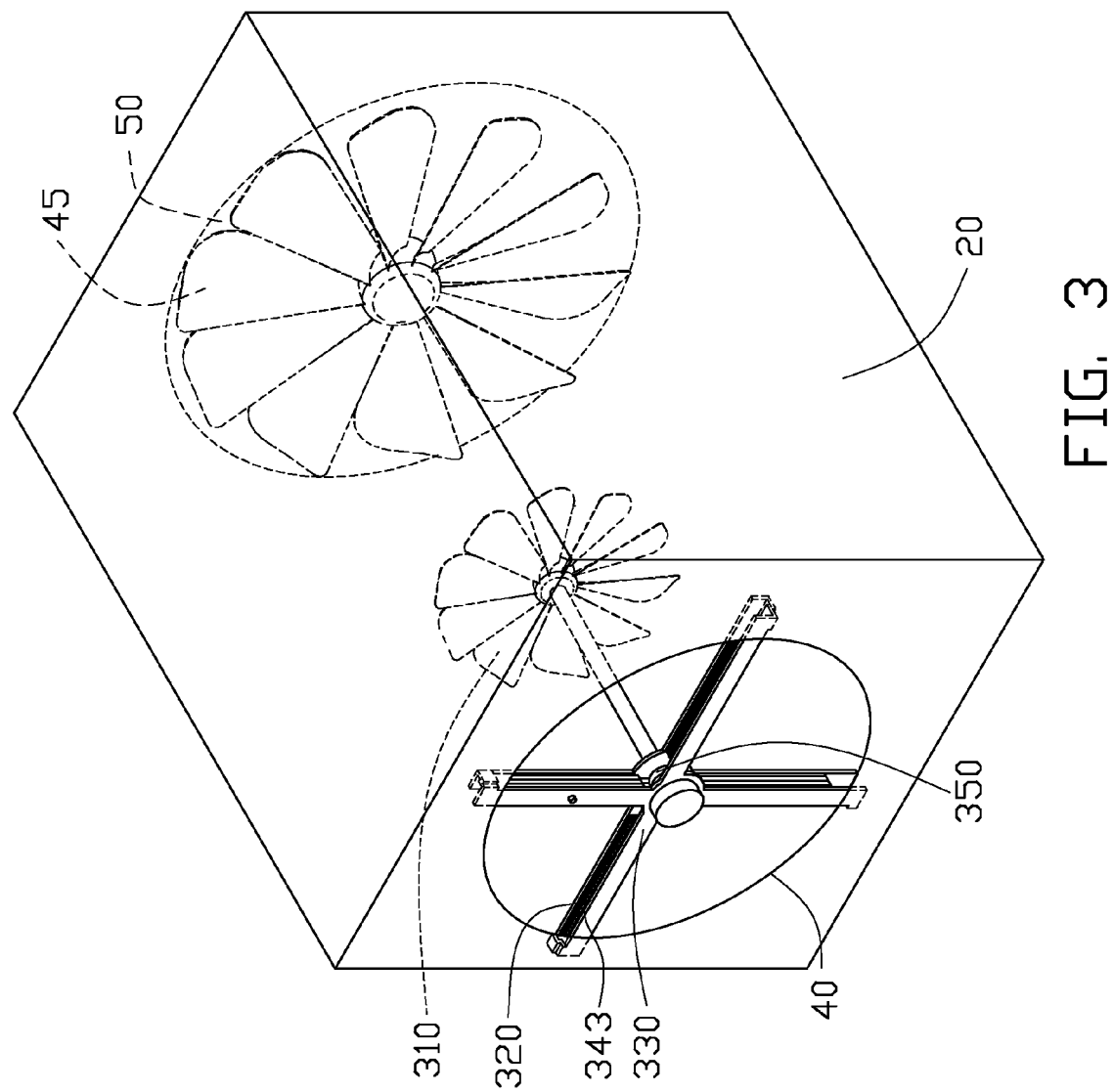
FIG. 3 is similar to FIG. 1, but showing the airflow reversal prevention assembly in an open position.

Referring to FIG. 3, in use, when the active fan 45 of the electronic device 20 rotates, air is drawn into the housing 22 through the inlet 50, and the forced air drives the passive fan 310 to rotate. Thus, the movable rack 320 is rotated relative to the fixed rack 330 by the elongated shaft 360. The abutting lips 327 of the movable rack 320 are disengaged from the corresponding stop tabs 338 of the fixed rack 330, and the torsion spring 350 is deformed. When each abutting lip 327 of the movable rack 320 is engaged with next stop tab 338 of the fixed rack 330, the movable rack 320 and the passive fan 310 stop rotating. Thus the curtain segments 343 of the curtain shelter 340 are folded up and the outlet 40 is open. At this time, the airflow reversal prevention assembly 30 is in an open position, and the forced air after absorbing heat generated by the functional components of the electronic device 20 flows out to the outside of the housing 22 through the outlet 40.

When the active fan 45 stops rotating, there is no force exerted on the passive fan 310, and consequently, on the movable rack 320. Thus the torsion spring 350 restores, causing the movable rack 320 to freely rotate in a reverse direction, together with the passive fan 310 by the elongated shaft 360. The curtain segments 343 of the curtain shelter 340 are spread open and cover the outlet 40 to prevent air from flowing into the housing 20 therethrough. The airflow reversal prevention assembly 30 returns to the closed position with the abutting lips 327 of the movable rack 320 being once again engaged with the corresponding original stop tabs 338 of the fixed rack 330.

Figure 4:
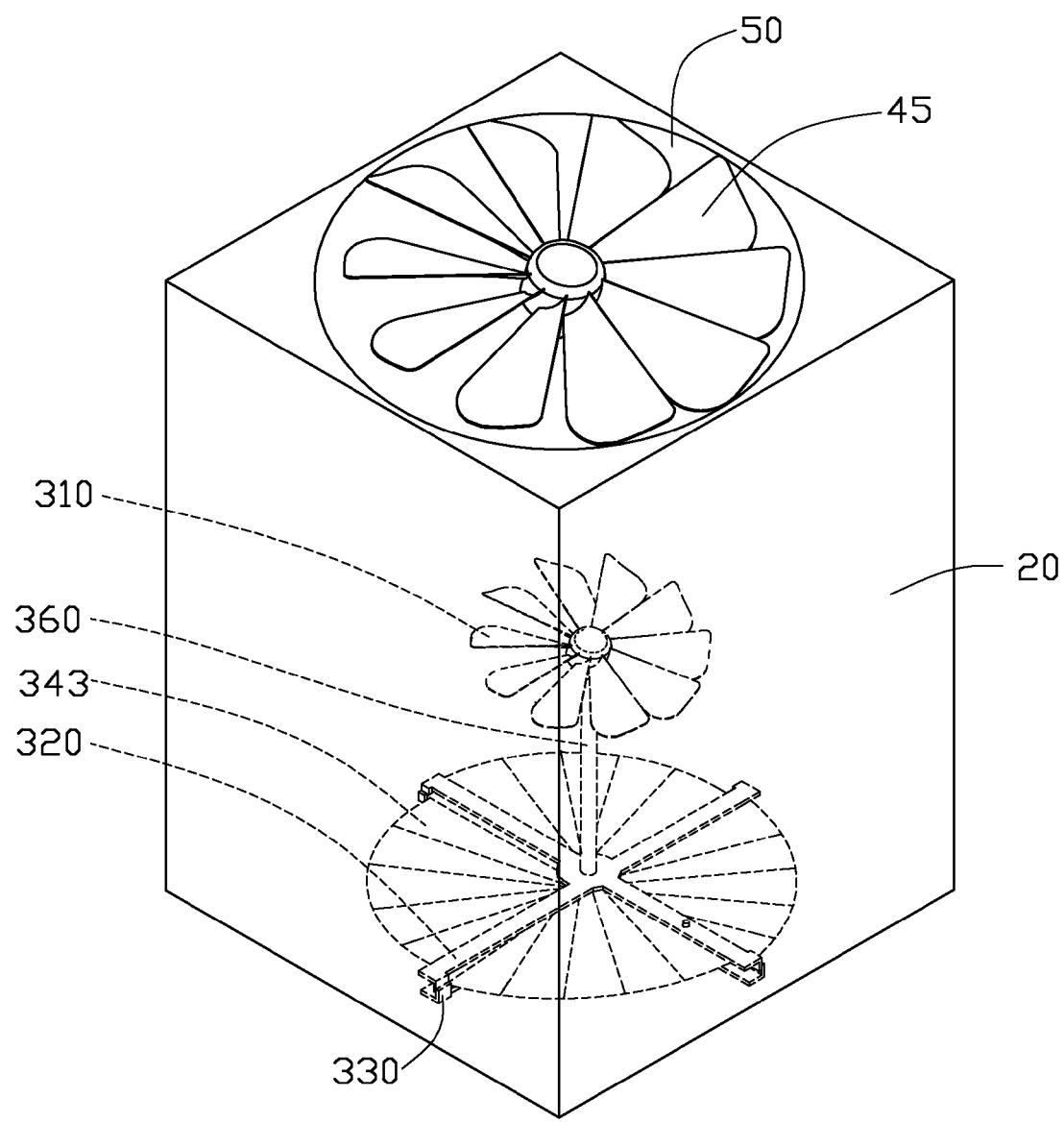
FIG. 4 shows a different using state from in FIG. 1, the electronic device being operated at a different angle.

The electronic device 20 can be placed in random positions to meet requirements of a variety of applications, for example, FIG. 4 shows the electronic device 20 operating at a different angle. The airflow reversal prevention assembly 30 may operate at any angle free of effects of gravity.

In other embodiments, the abutting lips 327 of the movable rack 320 and the stop tabs 338 of the fixed rack 330 can be omitted. When the resilience of the torsion spring is equal to the force exerted to the movable rack 320, the movable rack 320 stops rotating relative to the fixed rack 330.

Additionally, the airflow reversal prevention assembly 30 may be applied to ventilators or air conditioners which are used in sealed spaces such as air conditioned rooms.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic device comprising:
   a housing defining an inlet and an outlet;
   an active fan installed in the housing at the inlet; and
   an airflow reversal prevention assembly fixed in the housing, comprising:
      a fixed rack fixed at the outlet;
      a shaft rotatably secured to the fixed rack;
      a movable rack fixedly retained to the shaft;
      a curtain shelter attached between the fixed rack and the movable rack for covering the outlet;
      a passive fan fixedly mounted to the shaft, the passive fan being capable of being driven by air from the active fan to rotate, and driving the movable rack to rotate relative to the fixed rack by the shaft, whereby the curtain shelter being folded up and the outlet being open; and
      a resilient member capable of urging the movable rack to rotate back, whereby the curtain shelter being spread open to cover the outlet.

2. The electronic device of claim 1, wherein the movable rack comprises at least two elongated legs, the fixed rack comprises corresponding at least two elongated arms, and the curtain shelter comprises corresponding at least two curtain segments each attached between one of the at least two elongated legs of the movable rack and a corresponding one of the at least two elongated arms of the fixed rack.

3. The electronic device of claim 2, wherein each of the at least two curtain segments has a shape of sector, and two radial edges of each of the at least two curtain segments are attached to a corresponding elongated leg of the movable rack and an adjacent elongated arm of the fixed rack.

4. The electronic device of claim 3, wherein the at least two elongated legs comprises four elongated legs extending from a center of the movable rack, the at least two elongated arms comprises corresponding four elongated arms extending from a center of the fixed rack, the at least two curtain segments comprises corresponding four curtain segments, and each of the curtain segments comprises a plurality of leaves extending in a radial direction for being folded up conveniently.

5. The electronic device of claim 2, wherein an abutting lip is formed on one of the at least two elongated legs of the movable rack, and a stop tab is formed on one corresponding elongated arm of the fixed rack, for stopping the abutting lip to prevent the movable rack from rotating.

6. The electronic device of claim 2, wherein the movable rack further includes a center portion defining a through hole therein, the at least two elongated legs radially extend out from a peripheral edge of the center portion, the shaft is fixedly inserted in the through hole of the center portion.

7. The electronic device of claim 2, wherein the fixed rack further includes a center boss defining a shaft hole therein, the at least two elongated arms radially extend out from a circumference of the center boss, and a free end of the shaft is rotatably inserted in the shaft hole of the center boss.

8. The electronic device of claim 2, wherein an installing hole is defined in one of the at least two elongated legs of the movable rack, a retaining hole is defined in one of the at least two elongated arms of the fixed rack; and the resilient member is a spiral spring comprising a spiral portion located to the shaft, and two elongated ends being latched in the installing hole and the retaining hole, respectively.

9. An electronic device comprising:
   a housing defining two openings spaced from each other;
   an electric fan installed in the housing at one opening;
   a fixed rack fixed at the other opening;
   a combined passive fan and movable rack fixedly connected by a shaft, the combined passive fan and movable rack being rotatably mounted to the housing by virtue of the shaft, the movable rack being located between the passive fan and the fixed rack;
   a curtain shelter attached between the fixed rack and the movable rack for covering the associated opening; and
   an elastic means;
   wherein the passive fan is capable of being driven by air from the active fan to rotate, and driving the movable rack to rotate relative to the fixed rack by the shaft so that the curtain shelter is folded up and the associated opening is open; the elastic means is capable of urging the movable rack to rotate back so that the curtain shelter is spread open to cover the associated opening upon the condition that the passive fan stops rotating.

10. The electronic device of claim 9, wherein the movable rack comprises a center portion and at least two elongated legs radially extending out from a peripheral edge of the center portion, and a through hole is defined through the center portion to allow the shaft being fixedly inserted therein.

11. The electronic device of claim 10, wherein the fixed rack comprises a center boss and at least two elongated arms radially extend out from a circumference of the center boss, corresponding to the at least two elongated legs of the movable rack, and a shaft hole is defined in the center boss to allow the shaft being rotatably inserted therein.

12. The electronic device of claim 11, wherein the curtain shelter comprises at least two curtain segments each attached between one of the at least two elongated legs of the movable rack and a corresponding one of the at least two elongated arms of the fixed rack.

13. The electronic device of claim 12, wherein each of the at least two curtain segments has a shape of sector, and two radial edges of each of the at least two curtain segments are attached to a corresponding elongated leg of the movable rack and an adjacent elongated arm of the fixed rack.

14. The electronic device of claim 11, wherein an abutting lip is formed on one of the at least two elongated legs of the movable rack, a stop tab is formed on a corresponding one of the at least two elongated arms of the fixed rack for stopping the abutting lip to prevent the movable rack from rotating.

15. The electronic device of claim 11, wherein an installing hole is defined in one of the at least two elongated legs of the movable rack, a retaining hole is defined in one of the at least two elongated arms of the fixed rack; and the elastic means is a spiral spring comprising a spiral portion located to the shaft, and two elongated ends being latched in the installing hole and the retaining hole, respectively.

* * * * *